(12) United States Patent
Chen et al.

(10) Patent No.: US 8,492,079 B2
(45) Date of Patent: Jul. 23, 2013

(54) METHOD OF FORMING A PATTERN OF AN ARRAY OF SHAPES INCLUDING A BLOCKED REGION

(75) Inventors: Chia-Chen Chen, Fishkill, NY (US); Wu-Song Huang, Brewster, NY (US); Wai-Kin Li, Beacon, NY (US); Chandrasekhar Sarma, Poughkeepsie, NY (US)

(73) Assignees: International Business Machines Corporation, Armonk, NY (US); Infineon Technologies AG, Neubiberg (DE)

( * ) Notice: Subject to any disclaimer, the term of this patent is extended or adjusted under 35 U.S.C. 154(b) by 524 days.

(21) Appl. No.: 12/430,919

(22) Filed: Apr. 28, 2009

(65) Prior Publication Data

US 2010/0272967 A1 Oct. 28, 2010

(51) Int. Cl.
*G03F 7/20* (2006.01)

(52) U.S. Cl.
CPC .................. *G03F 7/70466* (2013.01)
USPC .................. 430/394; 430/311; 430/313

(58) Field of Classification Search
CPC .................................. G03F 7/70466
USPC ........................... 430/311, 313, 394
See application file for complete search history.

(56) References Cited

U.S. PATENT DOCUMENTS 6,664,011 B2  12/2003  Yu et al.
7,579,137 B2 *  8/2009  Colburn et al. ............... 430/313
7,727,708 B2 *  6/2010  Colburn et al. ............... 430/311
2007/0148598 A1 *  6/2007  Colburn et al. ............... 430/311
2008/0214011 A1  9/2008  Colburn et al.

FOREIGN PATENT DOCUMENTS

CN  1988130 A  6/2007
JP  200967795  4/2009

OTHER PUBLICATIONS

U.S. Appl. No. 11/538,475, entitled "Method of Patterning Contact Holes", filed Oct. 6, 2006, First Named Inventor: Wai-kin Li.

* cited by examiner

*Primary Examiner* — John Chu
(74) *Attorney, Agent, or Firm* — Scully, Scott, Murphy & Presser, P.C.; Yuanmin Cai

(57) ABSTRACT

A second photoresist having a second photosensitivity is formed on a substrate. A first photoresist having a first photosensitivity, which is greater than second photosensitivity, is formed on the second photoresist. Preferably, the first photoresist is a gray resist that becomes transparent upon exposure. At least one portion of the first photoresist is lithographically exposed employing a first reticle having a first pattern to form at least one transparent lithographically exposed resist portion, while the second photoresist remains intact. The second photoresist is lithographically exposed employing a second reticle including a second pattern to form a plurality of lithographically exposed shapes in the second photoresist. The plurality of lithographically exposed shapes have a composite pattern which is the derived from the second pattern by limiting the second pattern only within the area of the at least one transparent lithographically exposed resist pattern.

14 Claims, 12 Drawing Sheets

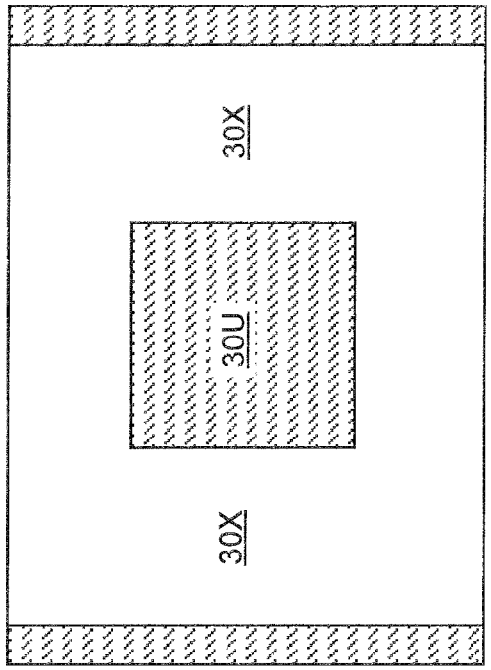
FIG. 3B
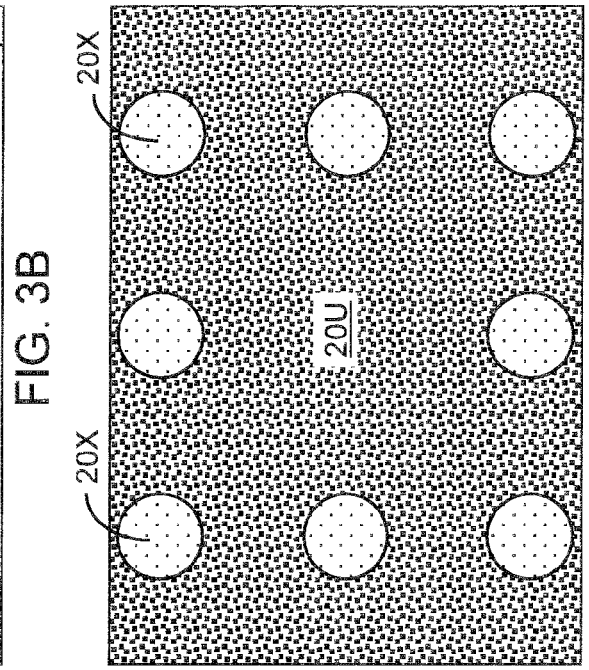
FIG. 3C
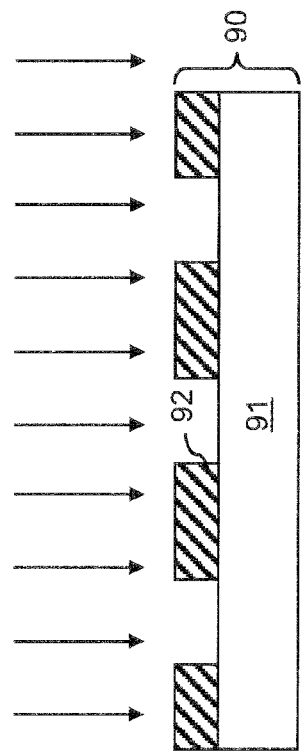
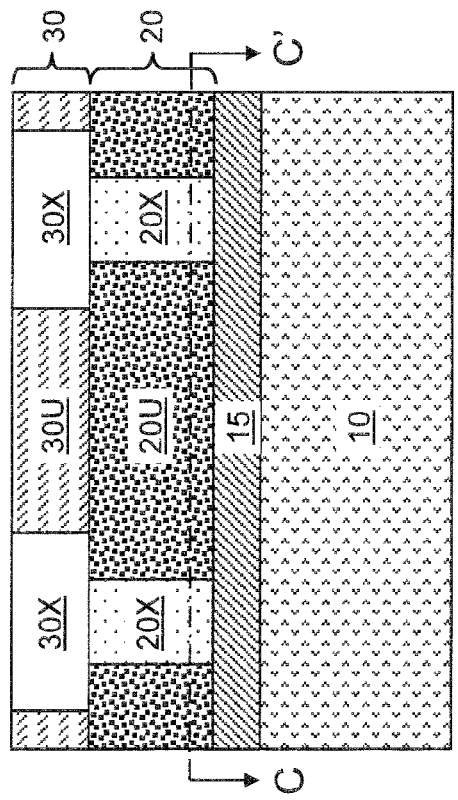
FIG. 3A

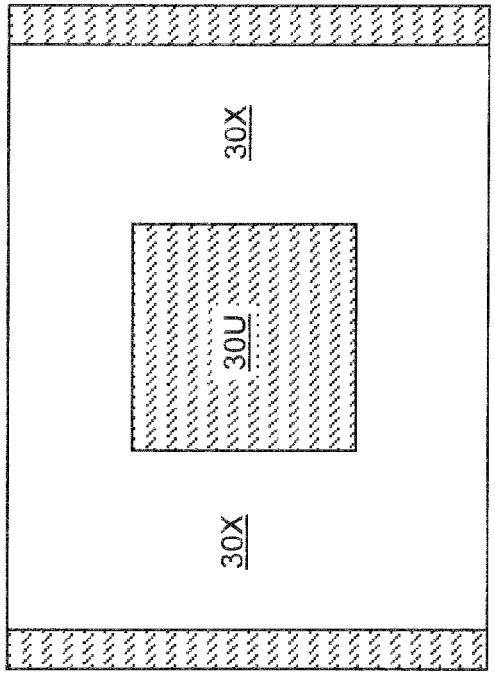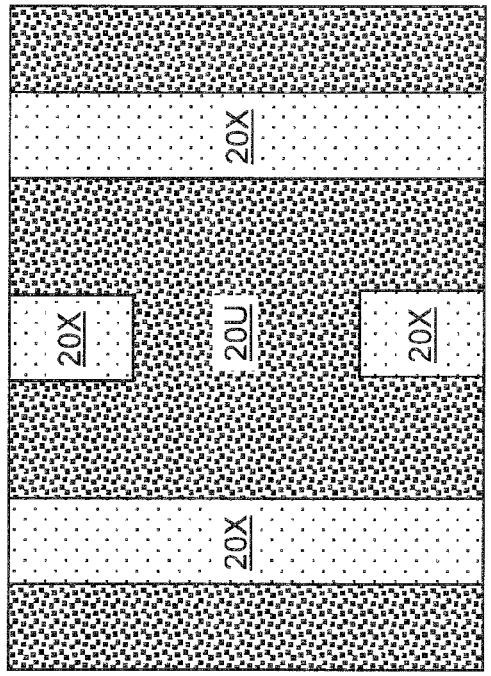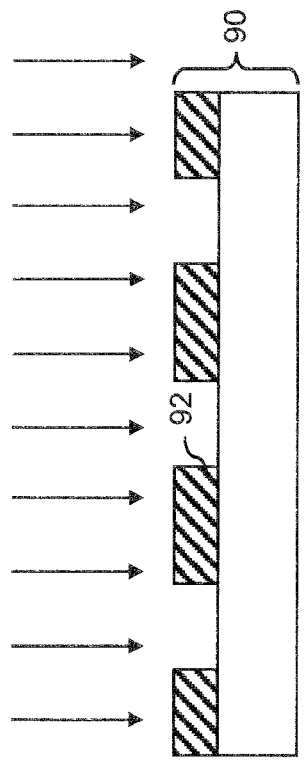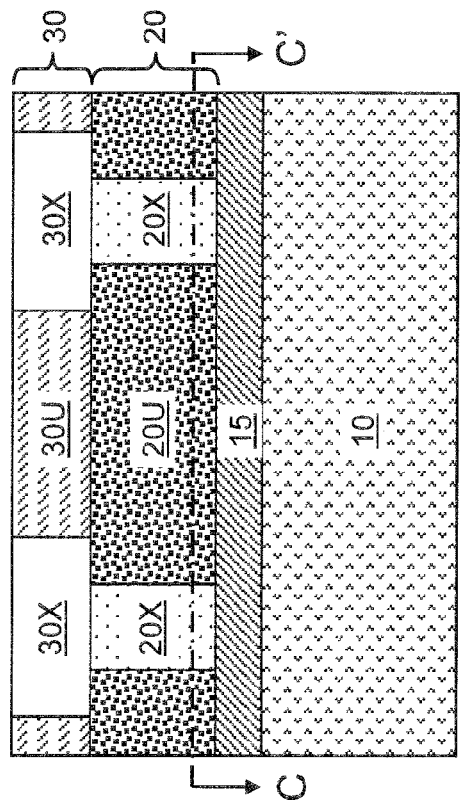

METHOD OF FORMING A PATTERN OF AN ARRAY OF SHAPES INCLUDING A BLOCKED REGION

FIELD OF THE INVENTION

The present invention relates to semiconductor processing methods, and particularly to methods for dual-exposure lithography employing a vertical stack of differentially sensitive photosensitive layers, and structures for effecting the same.

BACKGROUND OF THE INVENTION

Lithography is employed in semiconductor manufacturing to pattern features in a photoresist. A layer of photoresist is exposed to incident light, which may be deep-ultraviolet (DUV) radiation, mid-ultraviolet (MUV) radiation, or X-ray radiation. Alternately, the layer of photoresist may be exposed to energetic electron in e-beam lithography. The energy of the photons or electrons causes changes in chemical composition of exposed portions of the photoresist, for example, by cross-linkage, scission, side chain removal, etc. Pre-baking or post-baking of the photoresist may be employed to maximize the changes in the chemical properties of the exposed portion of the photoresist relative to unexposed portions of the photoresist.

The exposed photoresist is developed to remove one of the set of exposed portions of the photoresist and the set of unexposed portions of the photoresist relative to the other. The photoresist is classified as a positive photoresist or a negative photoresist depending on the nature of the chemical changes upon exposure. If the photoresist becomes chemically less stable upon exposure, the photoresist is a positive photoresist. If the photoresist becomes chemically more stable upon exposure, the photoresist is a negative photoresist. In case a positive photoresist is employed, the exposed portions of the positive photoresist are removed upon development. In case a negative photoresist is employed, the unexposed portions of the negative photoresist are removed upon development.

A developed photoresist comprises a lithographic pattern. The features of the lithographic pattern have dimensions that are the same as, or greater than, a "minimum feature size," which is also called a "critical dimension." The minimum feature size is a function of a lithography tool employed to form the lithographic pattern. The minimum feature size F that a projection system can print is given approximately by:

$$F = k \times \lambda / N_A,$$

where k is a coefficient that reflects tool specific proportionality constant reflecting the efficiency of the lithography system and other process related factors, $\lambda$ is the wavelength of the light employed for radiation, and $N_A$ is the numerical aperture of the lens. Typically, the value of the coefficient k is in the range of about 0.3 to about 0.5.

While the minimum feature size is defined only in relation to a lithography tool and normally changes from generation to generation of semiconductor technology, it is understood that the minimum feature size, i.e., the critical dimension, is to be defined in relation to the best performance of lithography tools available at the time of semiconductor manufacturing. The minimum feature sizes include a minimum line width and a minimum line spacing for a nested line pattern, and a minimum via hole diameter for a nested via hole pattern. In general, the minimum feature sizes vary depending on the geometry of the features to be printed on a photoresist. Given geometry and given a specific lithography tool, however, minimum feature sizes are defined as a quantifiable number. Further, since the minimum achievable wavelength is determined by the type of the light source in commercially available lithography tools, for given geometry, the minimum feature sizes may be defined based on the technological capabilities at any given time. As of 2009, the minimum feature sizes are about 40 nm and are expected to shrink in the future. Any dimension less than the lithographic minimum dimension is called a "sublithographic dimension."

The pattern in the developed photoresist is subsequently transferred into an underlying layer employing the developed photoresist and an etch mask. Thus, the dimensions of features that may be formed in a semiconductor structure are directly tied to the dimensions of features in the developed photoresist. The minimum pitch of a repetitive lithographic pattern is the twice the minimum feature size since each unit pattern includes a line and a space or a via hole and a surrounding spacer.

Standard lithographic methods form patterns having lithographic dimensions, i.e., dimensions that are greater than the minimum feature size. Each generation of lithography tools thus impose a limitation on the width, spacing, and the pitch of a lithographic pattern. Such limitations are an inherent limit on the size of unit cells of an array of semiconductor devices. For example, static random access memory (SRAM) devices, dynamic random access memory (DRAM) devices, and flash memory devices employ an array of unit cells.

SUMMARY OF THE INVENTION

The present invention provides methods of forming a lithographic pattern including a plurality of shapes and a non-patterned area. The lithographic pattern is transferred into an underlying layer by a pattern transfer.

In the present invention, a second photoresist having a second photosensitivity is formed on a substrate. A first photoresist having a first photosensitivity, which is greater than second photosensitivity, is formed on the second photoresist. Preferably, the first photoresist is a gray resist that becomes transparent upon exposure. At least one portion of the first photoresist is lithographically exposed employing a first reticle having a first pattern to form at least one transparent lithographically exposed resist portion, while the second photoresist remains intact. The second photoresist is lithographically exposed employing a second reticle including a second pattern to form a plurality of lithographically exposed shapes in the second photoresist. The plurality of lithographically exposed shapes have a composite pattern which is the derived from the second pattern by limiting the second pattern only within the area of the at least one transparent lithographically exposed resist pattern. The second pattern may employ interference from multiple shapes on the second mask to enhance pattern fidelity. Disruption of the second pattern by superposition of the first pattern in the composite pattern is eliminated because the second pattern is printed without modification, wherein the first pattern limits the area in which the second pattern is printed. Thus, the composite pattern has the benefit of the pattern fidelity made possible by employing the second pattern, while removing the second pattern from the area in which the first photoresist is not lithographically exposed.

According to an aspect of the present invention, a method of forming a patterned structure is provided, which includes: forming a stack of, from bottom to top, a second photoresist layer and a first photoresist layer on a substrate; lithographically exposing the first photoresist layer by illumination at a first exposure wavelength through a first mask having a first pattern, wherein at least one lithographically exposed first photoresist portion of the first photoresist layer becomes optically transparent at a second exposure wavelength; and lithographically exposing the second photoresist layer by illumination at a second exposure wavelength through a second mask having a second pattern, wherein a composite pattern is formed in at least one lithographically exposed second photoresist portion of the second photoresist layer, wherein the second composite pattern is the same as the second pattern that is limited only within an area of the at least one lithographically exposed first photoresist portion.

According to another aspect of the present invention, a patterned structure is provided, which includes: a stack of, from bottom to top, a second photoresist layer and a first photoresist layer located on a substrate, wherein the first photoresist layer includes at least one lithographically exposed first photoresist portion and at least one lithographically unexposed first photoresist portion that complimentarily fill an entirety of the first photoresist layer, wherein the second photoresist layer includes at least one lithographically exposed second photoresist portion and at least one lithographically unexposed second photoresist portion that complimentarily fill an entirety of the second photoresist layer, wherein the at least one lithographically exposed second photoresist portion is present only beneath the at least one lithographically exposed first photoresist portion but not beneath the at least one lithographically unexposed first photoresist portion.

BRIEF DESCRIPTION OF THE DRAWINGS

FIG. 3A is a vertical cross-sectional view of the first exemplary structure after lithographic exposure of the second photoresist layer according to the first embodiment of the present invention. FIG. 3B is a top-down view of the first exemplary structure at the step corresponding to FIG. 3A. FIG. 3C is a horizontal cross-sectional view of the first exemplary structure at the step corresponding to FIG. 3A.

FIG. 8A is a vertical cross-sectional view of a third exemplary structure after lithographic exposure of the second photoresist layer according to a third embodiment of the present invention. FIG. 8B is a top-down view of the third exemplary structure at the step corresponding to FIG. 8A. FIG. 8C is a horizontal cross-sectional view of the third exemplary structure at the step corresponding to FIG. 8A.

DETAILED DESCRIPTION OF THE INVENTION

Figure 1A:
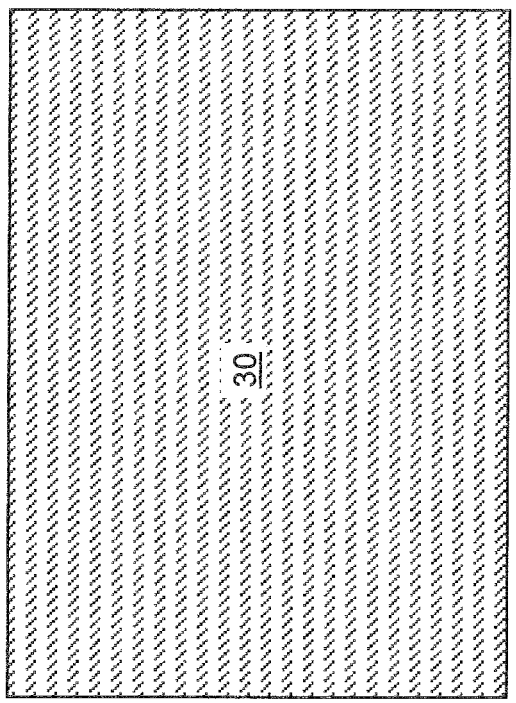
FIG. 1A is a vertical cross-sectional view of a first exemplary structure after application of a BARC layer, a second photoresist layer, and a first photoresist layer according to a first embodiment of the present invention.

As stated above, the present invention relates to methods for dual-exposure lithography employing a vertical stack of differentially sensitive photosensitive layers, and structures for effecting the same, which are now described in detail with accompanying figures. Throughout the drawings, the same reference numerals or letters are used to designate like or equivalent elements. The drawings are not necessarily drawn to scale.

Figure 1B:
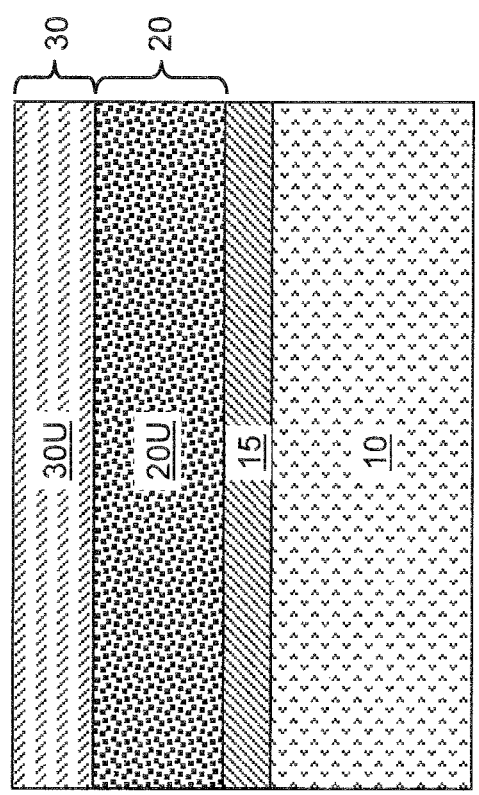
FIG. 1B is a top-down view of the first exemplary structure at the step corresponding to FIG. 1A.

Referring to FIGS. 1A and 1B, a first exemplary structure according to a first embodiment of the present invention includes a substrate 10, a bottom anti-reflective coating (BARC) layer 15, a second photoresist layer 20, and a first photoresist layer 30. The substrate 10 may include a semiconductor material, an insulator material, a conductive material, or a combination thereof. In case the substrate 10 includes a semiconductor material, the substrate 10 may include a bulk semiconductor substrate, a semiconductor-on-insulator (SOI) substrate, or a hybrid substrate having different surface crystallographic orientations and including, but not limited to, a bulk portion and/or an SOI portion. The substrate 10 may include at least one semiconductor device such as a field effect transistor (FET), a diode, a resistor, a capacitor, an inductor, and/or an integrated circuit (IC) including a combination of various semiconductor devices. The substrate 10 may, or may not, include at least one metal interconnect structure such as a dielectric layer embedding metal lines, metal vias, or a combination thereof.

A stack including, from bottom to top, of an optional bottom anti-reflective coating (BARC) layer, a second photoresist layer 20, and a first photoresist layer 30 is formed on a substrate. This stack may be formed, for example, in a lithographic stepper including multiple spin coating stations and at least one curing chamber so that the stack may be formed within the lithographic stepper in a single processing step. Alternately, multiple lithographic steppers and/or dedicated curing tools may be employed to form the stack.

The BARC layer 15 may be formed by any conventional method of forming a lithographic material layer, which may be, for example, spin coating. The BARC layer 15 comprises a material that reduces light reflection at the wavelengths of illumination on the first photoresist layer 30 and the second photoresist layer 20. The BARC layer 15 typically comprises an organic material including a light absorber material and a polymer material. For example, the BARC layer 15 may include a crosslinking agent component substituted by hydroxylalkyl group or alkoxyalkyl group, a benzophenone-based, diphenylsulfone-based or diphenylsulfoxide-based dye component and an acrylic resin. The composition of the BARC layer 15 may be optimized depending on the composition of the first photoresist layer 30 and the second photoresist layer 20. The thickness of the BARC layer 15 may be from 5 nm to 120 nm, and typically from 20 nm to 100 nm, although lesser and greater thicknesses area also contemplated herein. The parameters for optimization of the thickness of the BARC layer 15 include the optical properties and thicknesses of the first photoresist layer 30 and the second photoresist layer 20. The BARC layer 15 is optional in the structures of the present invention, i.e., may, or may not, be employed.

The second photoresist layer 20 is formed either directly on the top surface of the substrate 10 or on the top surface of the BARC layer 15. The second photoresist layer 20 may be formed, for example, by spin coating. The second photoresist layer 20 comprises a material that is photosensitive at a wavelength range. The second photoresist layer 20 may comprise a deep ultraviolet (DUV) photoresist, a mid-ultraviolet (MUV) photoresist, an extreme ultraviolet (EUV) photoresist, or an electron beam (e-beam) photoresist. The material of the second photoresist layer 20 reacts to illumination and is chemically changed, for example, by cross-linking, in the wavelength range within which the second photoresist layer 20 is photosensitive. The thickness of the second photoresist layer 20 may be from 30 nm to 1,000 nm, and typically from 60 nm to 600 nm, although lesser and greater thicknesses area also contemplated herein.

The first photoresist layer 30 is formed on the top surface of the second photoresist layer 20. The first photoresist layer 30 may be formed, for example, by spin coating. The first photoresist layer 30 comprises a material that is photosensitive at a different wavelength range than the wavelength range in which the second photoresist layer 20 is photosensitive. The thickness of the first photoresist layer 30 may be from 20 nm to 1,000 nm, and typically from 30 nm to 600 nm, although lesser and greater thicknesses area also contemplated herein.

The material of the first photoresist layer 30 that is employed in the present invention includes, but is not limited to, a composition referred to as a "gray resist." A gray resist includes a resist polymer with an absorbing moiety. The absorbing moiety of the resist polymer of the gray resist may be any chemical moiety that absorbs radiation at the exposure wavelength. Preferably, the absorbing moiety includes, but is not limited to, unsubstituted and substituted aromatic moieties such as benzene, naphthalene, hydroxy-substituted benzene, and hydroxy-substituted naphthalene. Examples of resist polymers for the gray resist include polymers containing polycyclic moieties commonly used in 193 nm photoresists and phenol groups commonly used in 248 nm photoresists. In addition to the resist polymer, the gray resist further comprises a photoacid generator and a solvent. Preferably, the gray resist also contains a quencher. Examples of suitable gray resist polymers that can be employed includes:

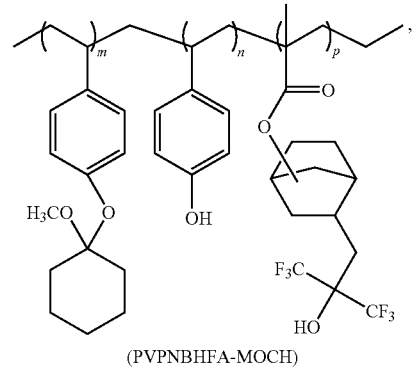

(PVPNBHFA-MOCH)

where m, n, and p are integers representing the number of repeating units, each independently ranging between 1 and about 50,000.

In another example, the grey resist employed in the present invention comprises a photosensitive acid generator and a polymer, where the polymer comprises at least one absorbing moiety which is cleavable from the polymer upon thermal treatment in the presence of acid. The photosensitive acid generator produces acid upon exposure to the radiation having a wavelength or range of wavelengths.

The absorbing moiety may be linked to the polymer backbone via an acid-cleavable linkage. Example of absorbing moieties include unsubstituted aromatic moieties and substituted aromatic moieties. For example, the absorbing moiety may comprise benzene, naphthalene, hydroxy-substituted benzene, or hydroxy-substituted naphthalene groups. Examples of acid-cleavable linkages include groups such as tertiary esters, tertiary carbonates, tertiary ethers, acetals, ketals, the like, and combinations of these. For example, in at least one embodiment, the polymer structure comprises repeating units containing the absorbing moiety, where the repeating unit comprises:

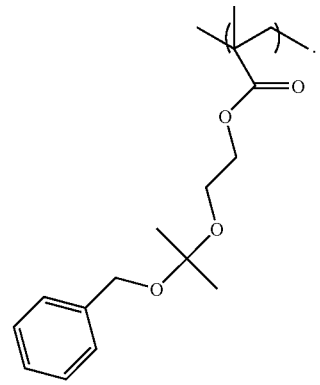

In some embodiments, the polymer is substantially soluble in aqueous base developer and remains substantially soluble even after the thermal treatment and after the exposure to the radiation, resulting in the grey resist remaining substantially soluble in aqueous base developer. For such a composition, no relief patterns may be developed, in contrast with photoresists which can be patternwise exposed and then developed to form relief images.

The polymer may further comprise at least one base soluble moiety, such as alcohol, fluoroalcohol, phenol, naphthol, sulfonamide, fluorosulfonamide, dicarboxylmides, N-hydroxy dicarboxylmide, carboxylic acid, amino group, imino group, the like, and combinations thereof. For example, the second polymer may comprise:

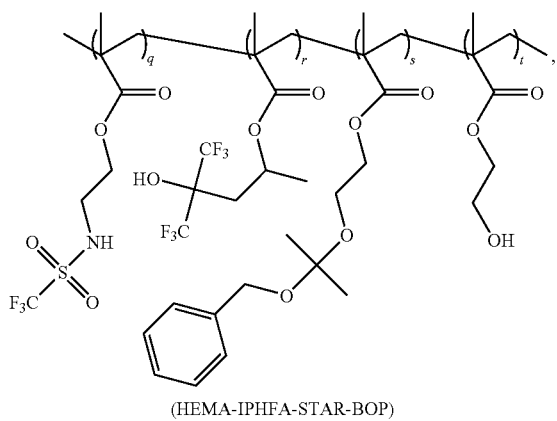

(HEMA-IPHFA-STAR-BOP)

where q, r, s, and t are integers representing the number of repeating units, each independently ranging between 1 and about 50,000.

The gray resist is selected to have much higher sensitivity toward to one wavelength of light as the second photoresist layer 20. In other words, there is at least one wavelength at which the gray resist react to illumination, while the material of the second photoresist layer 20 does not react much to illumination at that wavelength.

In general, the combination of the material for the first photoresist layer 30 and the material for the second photoresist layer 20 is selected such that there exists at least one wavelength, which is herein referred to a "first exposure wavelength," at which the material of the first photoresist layer 30 reacts to illumination, while the material of the second photoresist layer 20 does not react much to illumination at that wavelength.

Further, the combination of the material for the first photoresist layer 30 and the material for the second photoresist layer 20 is selected such that there exists at least another wavelength, which is herein referred to a "second exposure wavelength," at which the material of the second photoresist layer 20 reacts to illumination, while the material of the first photoresist layer 30 has high absorption or opaque at that wavelength. The first exposure wavelength can be the same or different from the second exposure wavelength.

The material of the first photoresist layer 30 has an absorption parameter k having a non-zero value at the second exposure wavelength. The absorption parameter k indicates the amount of absorption loss when an electromagnetic wave propagates through a material. The absorption parameter of the material of the first photoresist 30, as provided at this step without any chemical change, is preferably greater than 0.1 at the second exposure wavelength. Thus, the value of the absorption parameter is high enough to reduce the intensity of illumination at the second exposure wavelength to less than 50% of the initial intensity within the material of the first photoresist layer 30 at the thickness of the first photoresist layer 30. The intensity of illumination at the second exposure wavelength is reduced to an intensity of preferably less than 35%, more preferably less than 25%, and most preferably less than 10%, of the initial intensity upon traveling through the first photoresist layer 30 at normal incidence.

In addition, the composition of the material for the first photoresist layer 30 is selected such that the material of lithographically exposed portions of the first photoresist layer 30 is optically transparent at the second exposure wavelength. The intensity of illumination at the second exposure wavelength after passing through the material of the lithographically exposed and chemically changed portions of the first photoresist layer 30 at normal incidence is at least 70% of the initial intensity of illumination. The intensity of illumination at the second exposure wavelength after passing through the material of the lithographically exposed and chemically changed portions of the first photoresist layer 30 at normal incidence is preferably at least 80%, more preferably at least 90%, and most preferably at least 95%, of the initial intensity of illumination.

Modulation of the wavelength ranges in which the materials of the first and second photoresist layers (30, 20) are photosensitive may be effected by controlling the chemical composition of the materials of the first and second photoresist layers (30, 20) such that the bonding energy or the activation energy of a chemical do not coincide between the materials of the first and second photoresist layers (30, 20).

The material of the first photoresist layer 30 may be a positive photoresist that becomes chemically less stable upon lithographic exposure to light, or may be a negative photoresist that becomes chemically more stable upon lithographic exposure to light. The material of the second photoresist layer 20 is a positive photoresist that becomes chemically less stable upon exposure.

Figure 2B:
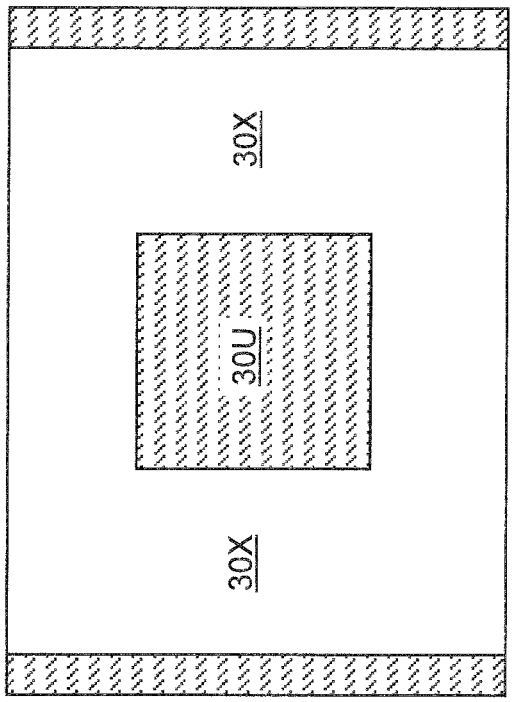
FIG. 2B is a top-down view of the first exemplary structure at the step corresponding to FIG. 2A.
Figure 2A:
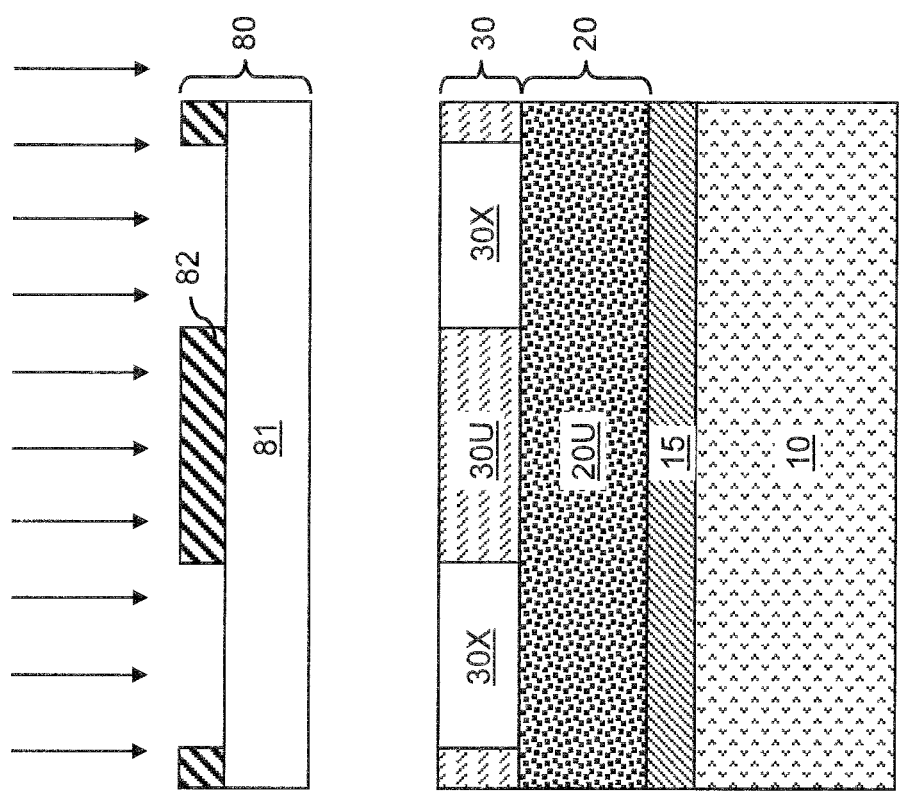
FIG. 2A is a vertical cross-sectional view of the first exemplary structure after lithographic exposure of the first photoresist layer according to the first embodiment of the present invention.

Referring to FIGS. 2A and 2B, a first lithographic mask 80 having a first transparent layer 81 and a first patterned opaque layer 82 is employed to lithographically expose the first photoresist layer 30. This lithographic exposure step is herein referred to as a first lithographic exposure. The wavelength of the illumination at this step is the first exposure wavelength. The pattern of the transparent area of the first lithographic mask 80 is herein referred to as a first pattern. Preferably, the plane of focus of the illumination at the first exposure wavelength is located between the top surface of the first photoresist layer 30 and the bottom surface of the first photoresist layer 30. The lithographically exposed portions of the first photoresist layer 30 are herein referred to as lithographically exposed first photoresist portions 30X. The lithographically unexposed portions of the first photoresist layer 30 are herein referred to as lithographically unexposed first photoresist portions 30U. The lithographically exposed first photoresist portions 30X and the lithographically unexposed first photoresist portions 30U complimentarily fill the entirety of the first photoresist layer 30.

As discussed above, the material of the second photoresist layer 20 does not react much to illumination at the first exposure wavelength, i.e., the material of the second photoresist layer 20 is not chemically changed much during the first lithographic illumination step.

Each lithographically exposed first photoresist portion 30X becomes optically transparent at the second exposure wavelength, which is different from or the same as the first exposure wavelength. The lithographically unexposed first resist portions 30U remain optically opaque at the second exposure wavelength.

The transparent area of the first lithographic mask 80 includes a pattern, which is the first pattern. Thus, the collection of the lithographically exposed first photoresist portions 30X form the first pattern as seen from above, i.e., as seen in the direction of the surface normal of the first photoresist layer 30. The lithographically exposed first photoresist portions 30X form areas in which the first photoresist layer 30 is transparent to radiation at the second exposure wavelength.

Referring to FIGS. 3A-3C, a second lithographic mask 90 having a second transparent layer 91 and a second patterned opaque layer 92 is employed to lithographically expose the second photoresist layer 20. This lithographic exposure step is referred to herein as a second lithographic exposure. The wavelength of the illumination at this step is the second exposure wavelength. The pattern of the transparent area of the second lithographic mask 90 is referred to herein as a second pattern. Preferably, the plane of focus of the illumination at the second exposure wavelength is located between the top surface of the second photoresist layer 20 and the bottom surface of the second photoresist layer 20.

The lithographically exposed portions of the second photoresist layer 20 are referred to herein as lithographically exposed second photoresist portions 20X. The lithographically unexposed portions of the second photoresist layer 20 are referred to herein as lithographically unexposed second photoresist portions 20U. The lithographically exposed second photoresist portions 20X and the lithographically unexposed second photoresist portion 20U complimentarily fill the entirety of the second photoresist layer 20. The lithographically exposed first photoresist portions 30X and the lithographically unexposed first photoresist portions 30U remain on the second photoresist layer 20 during the lithographically exposing of the second photoresist layer 20 by illumination at the second exposure wavelength.

The lithographically exposed first photoresist portions 30X are transparent to illumination at the second exposure wavelength, while the lithographically unexposed first photoresist portions 30U are opaque to illumination at the second exposure wavelength. Therefore, the material of the second photoresist layer 20 can be exposed to the illumination at the second lithographic exposure only beneath the area of the lithographically exposed first photoresist portions 30X, but cannot be formed beneath the lithographically unexposed first photoresist portions 30U. Thus, the first pattern replicated within the first photoresist layer 30 by the lithographically exposed first photoresist portions 30X defines an area within which another pattern may be transferred into the second photoresist layer 20 during the second lithographic exposure. The lithographically exposed second photoresist portions 20X are formed only beneath the lithographically exposed first resist portions 30X, but not beneath the lithographically unexposed first resist portions 30U. The lithographically exposed first photoresist portions 30X and the lithographically unexposed first photoresist portions 30U remain on the second photoresist layer 20 during the lithographically exposing of the second photoresist layer 20 by illumination at the second exposure wavelength.

Thus, a composite pattern is formed in the collection of the lithographically exposed second photoresist portions 20X. The second composite pattern is the same as the second pattern that is limited only within an area of the lithographically exposed first photoresist portions 30X. The portions of the second pattern located outside the area of the first pattern is not transferred into the second photoresist layer 20. Thus, every point within the composite pattern is a point that is included in the intersection of the shape of the first pattern and the shape of the second pattern. Conversely, every point outside the composite pattern is a point that is included in the union of the complement of the first shape and the complement of the second shape. The area of the lithographically exposed first photoresist portions 30X coincides with the composite pattern.

The collection of the lithographically exposed second photoresist portions 20X form the composite pattern in a horizontal cross-sectional view. The area of the lithographically exposed second photoresist portions 20X has the composite pattern, which includes the shapes of areas that are common between the first pattern and the second pattern.

The second pattern may be a periodic pattern or a non-periodic pattern. The second pattern may include an array of via shapes. In case of a periodic pattern, the periodic pattern may contain a periodic array of via shapes. The periodic array of via shapes may be a one-dimensional array or a two-dimensional array.

Figure 4B:
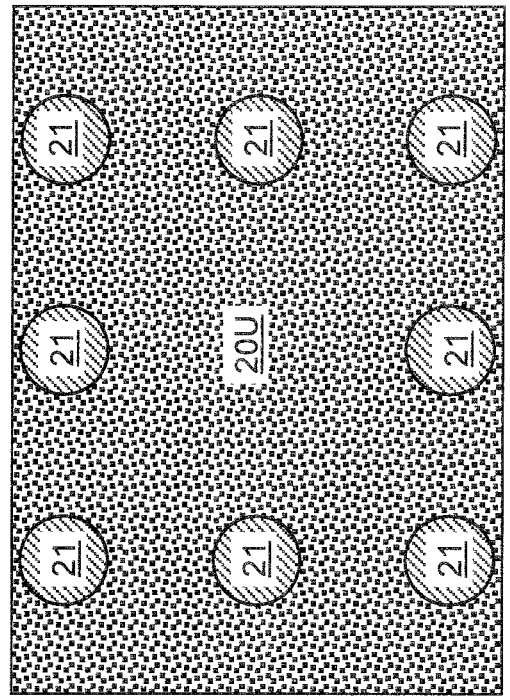
FIG. 4B is a top-down view of the first exemplary structure at the step corresponding to FIG. 4A.
Figure 4A:
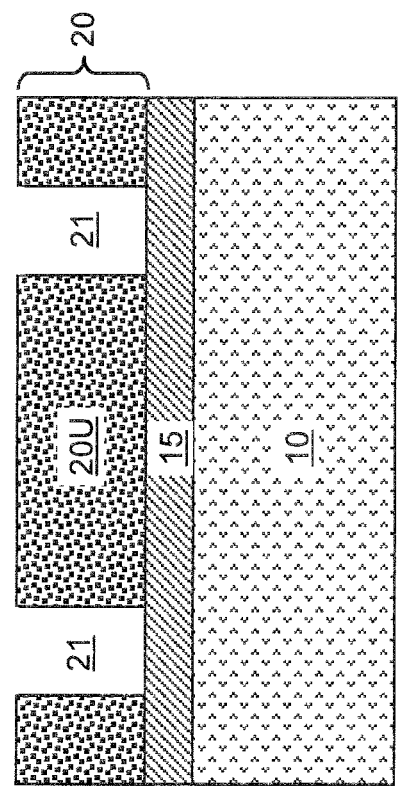
FIG. 4A is a vertical cross-sectional view of the first exemplary structure after removal of the first photoresist layer and exposed portions of the second photoresist layer according to the first embodiment of the present invention.

Referring to FIGS. 4A and 4B, all of the first photoresist layer 30 is removed from above the second photoresist layer 20, for example, employing an aqueous base developing solution. Further, the lithographically exposed second photoresist portions 20X are removed selectively to the lithographically unexposed second photoresist portions 20U. The removal of the lithographically exposed second photoresist portions 20X may be effected at the same processing step as the removal of the first photoresist layer 30 employing the same developing solution, or may be effected in a subsequent processing step employing a different developing solution. Only the lithographically unexposed second photoresist portion 20U on the BARC layer 15 or the substrate 10. Top surfaces of the BARC layer 15 or the substrate 10 are exposed at the bottom of via cavities 21 that are formed in the area of the composite shape within the lithographically unexposed second photoresist portions 20U.

Figure 5B:
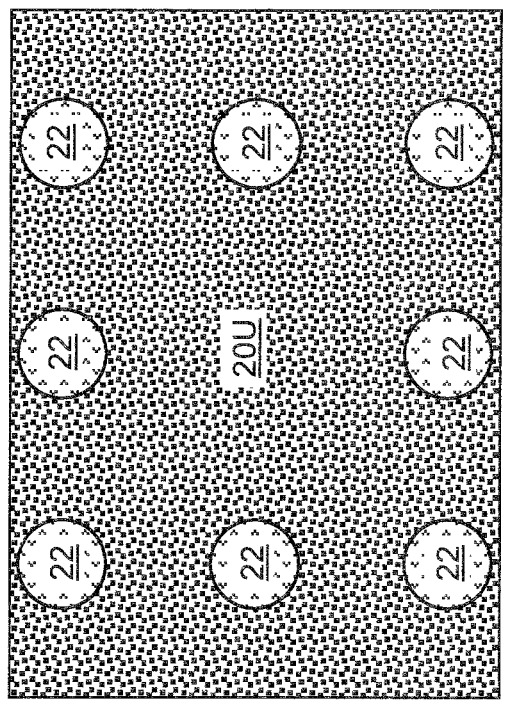
FIG. 5B is a top-down view of the first exemplary structure at the step corresponding to FIG. 5A.
Figure 5A:
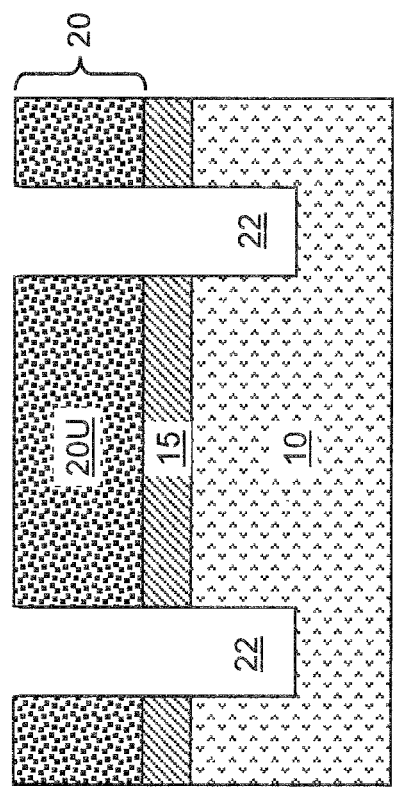
FIG. 5A is a vertical cross-sectional view of the first exemplary structure after transfer of a composite pattern into the substrate according to the first embodiment of the present invention.

Referring to FIGS. 5A and 5B, the composite pattern defined by the cavities within the lithographically unexposed second photoresist portion 20U is transferred into the BARC layer 15, if present, and into the substrate 10, for example, by etching employing the lithographically unexposed second photoresist portion 20U as an etch mask. The lithographically unexposed second photoresist portion 20U and the BARC layer 15 are subsequently removed selective to the material of the substrate 10. The substrate 10 includes via cavities 22 in the shape of the composite pattern.

Figure 6B:
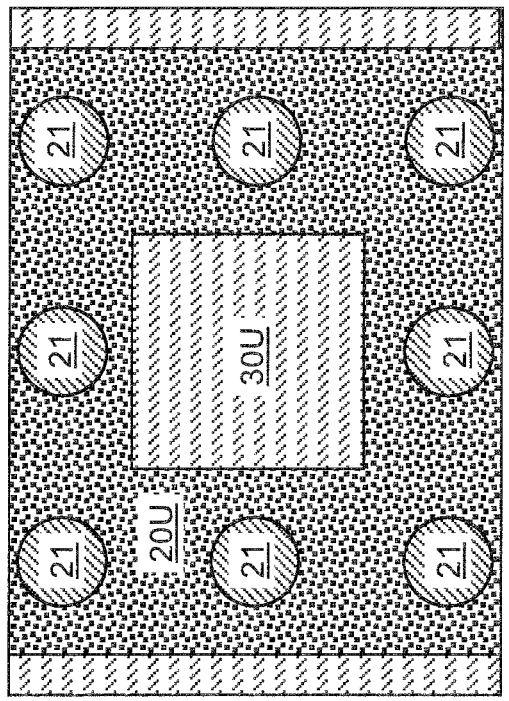
FIG. 6B is a top-down view of the second exemplary structure at the step corresponding to FIG. 6A.
Figure 6A:
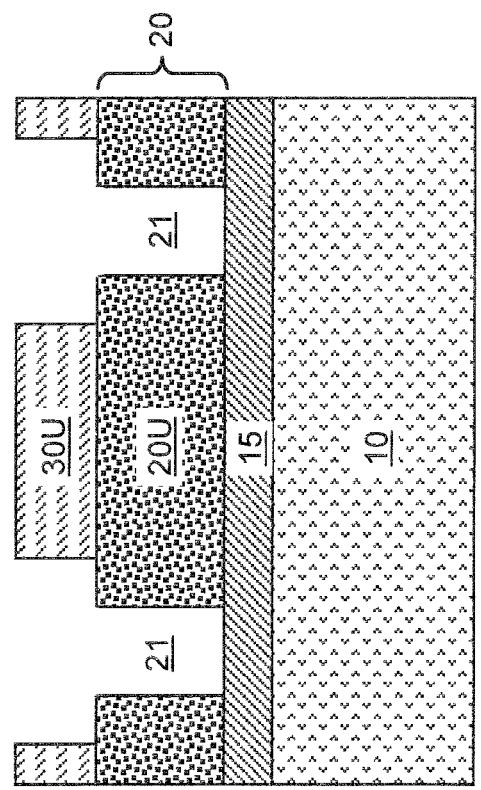
FIG. 6A is a vertical cross-sectional view of a second exemplary structure after removal of exposed portions of the first photoresist layer and exposed portions of the second photoresist layer according to a second embodiment of the present invention.

Referring to FIGS. 6A and 6B, a second exemplary structure according to a second embodiment of the present invention is derived from the first exemplary structure of FIGS. 3A-3C. In the second embodiment, the material of the first photoresist layer 30 is a positive photoresist that becomes chemically less stable after the first lithographic exposure. After the second lithographic exposure, the lithographically exposed first photoresist portions 30X are removed selective to lithographically unexposed first photoresist portions 30U. Then, the lithographically exposed second photoresist portions are removed selective to the lithographically unexposed second photoresist portion 20U and the lithographically unexposed first photoresist portions 30U.

In many instances, the unexposed first photoresist portion 30U may be sensitive to the second exposure light and removed during the removal of 20X, but no portion of the lithographically unexposed second photoresist portion 20U located under the unexposed first photoresist portion 30U will be removed. Top surfaces of the BARC layer 15 or the substrate 10 are exposed at the bottom of via cavities 21 that are formed in the area of the composite shape within the lithographically unexposed second photoresist portions 20U.

Figure 7B:
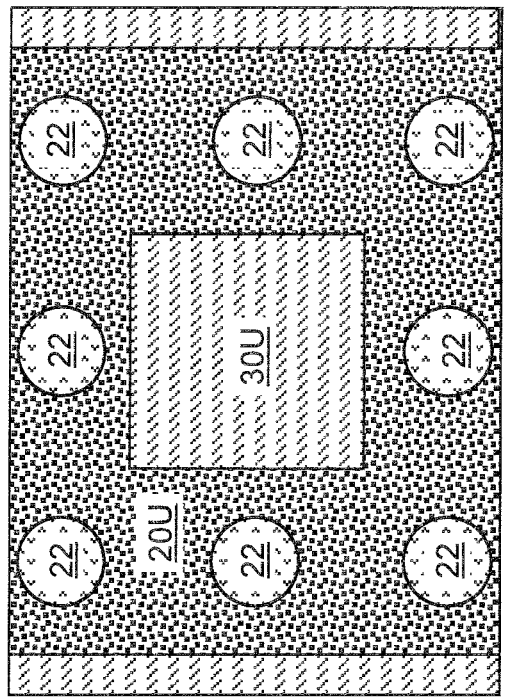
FIG. 7B is a top-down view of the second exemplary structure at the step corresponding to FIG. 7A.
Figure 7A:
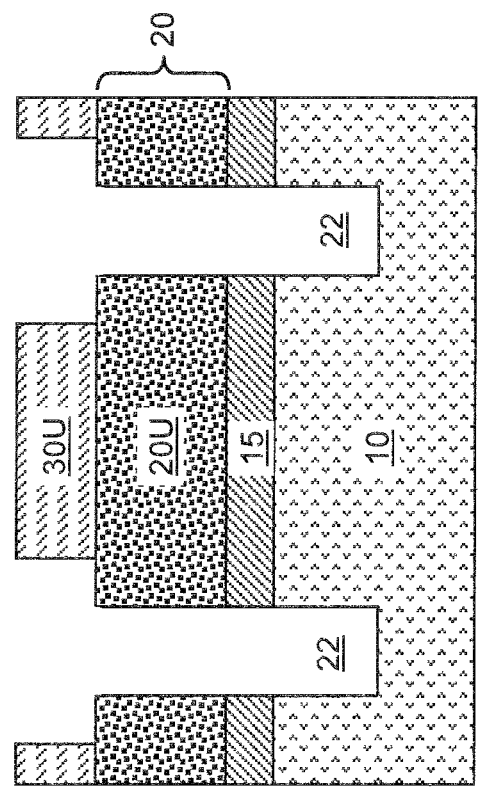
FIG. 7A is a vertical cross-sectional view of the second exemplary structure after transfer of a composite pattern into the substrate according to the second embodiment of the present invention.

Referring to FIGS. 7A and 7B, the composite pattern defined by the cavities within the lithographically unexposed second photoresist portion 20U is transferred into the BARC layer 15, if present, and into the substrate 10, for example, by etching employing a combination of the lithographically unexposed first photoresist portion 30U and the lithographically unexposed second photoresist portion 20U as an etch mask. The lithographically unexposed second photoresist portion 20U, the lithographically unexposed first photoresist portion 30U, and the BARC layer 15 are subsequently removed selective to the material of the substrate 10. The substrate 10 includes via cavities 22 in the shape of the composite pattern.

Referring to FIGS. 8A-8C, a third exemplary structure according to a third embodiment of the present invention is derived from the first exemplary structure of FIGS. 2A and 2B by employing a second pattern including an array of line shapes. For example, the array of line shapes may be a periodic array of line shapes having the same widths and the same spacing between neighboring line shapes. The same processing steps may be employed in the third embodiment as in the first embodiment.

Figure 9B:
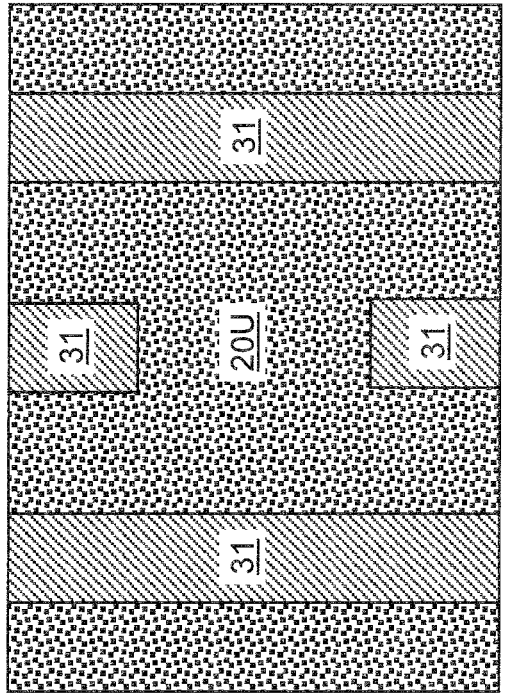
FIG. 9B is a top-down view of the third exemplary structure at the step corresponding to FIG. 9A.
Figure 9A:
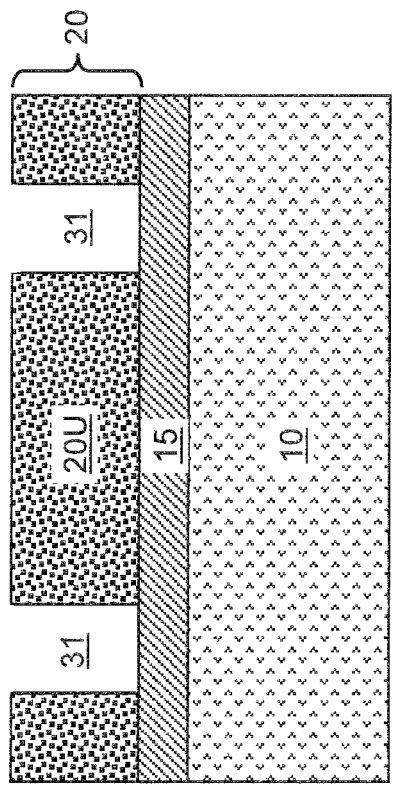
FIG. 9A is a vertical cross-sectional view of the third exemplary structure after removal of the first photoresist layer and exposed portions of the second photoresist layer according to the third embodiment of the present invention.

Referring to FIGS. 9A and 9B, all of the first photoresist layer 20 is removed from above the second photoresist layer 20, and the lithographically exposed second photoresist portions 30U are removed selective to the lithographically unexposed second photoresist portions 20U in the same manner as in the first embodiment. Top surfaces of the BARC layer 15 or the substrate 10 are exposed at the bottom of line cavities 31 that are formed in the area of the composite shape within the lithographically unexposed second photoresist portions 20U.

Figure 10B:
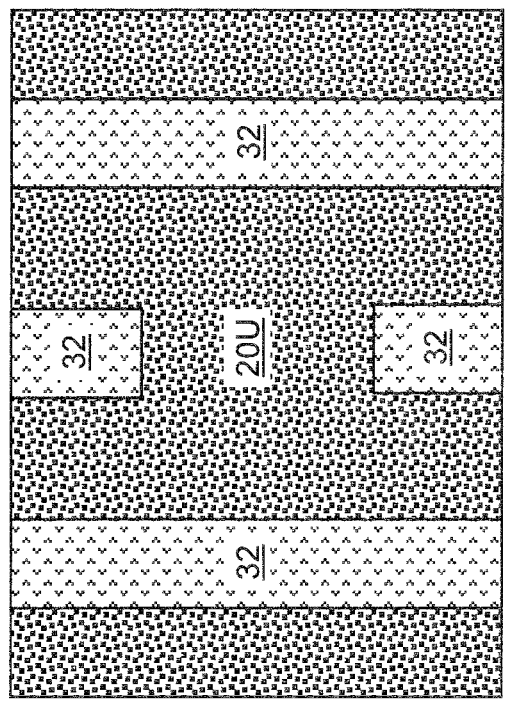
FIG. 10B is a top-down view of the third exemplary structure at the step corresponding to FIG. 10A.
Figure 10A:
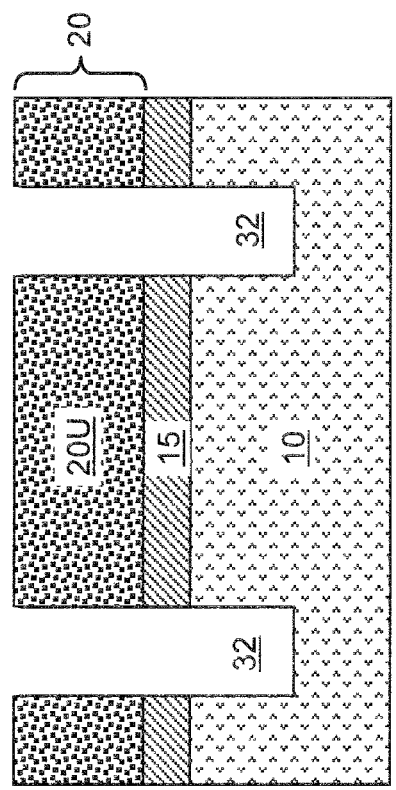
FIG. 10A is a vertical cross-sectional view of the third exemplary structure after transfer of a composite pattern into the substrate according to the third embodiment of the present invention.

Referring to FIGS. 10A and 10B, the composite pattern defined by the cavities within the lithographically unexposed second photoresist portion 20U is transferred into the BARC layer 15, if present, and into the substrate 10, for example, by etching employing the lithographically unexposed second photoresist portion 20U as an etch mask. The lithographically unexposed second photoresist portion 20U and the BARC layer 15 are subsequently removed selective to the material of the substrate 10. The substrate 10 includes line cavities 32 in the shape of the composite pattern.

Figure 11B:
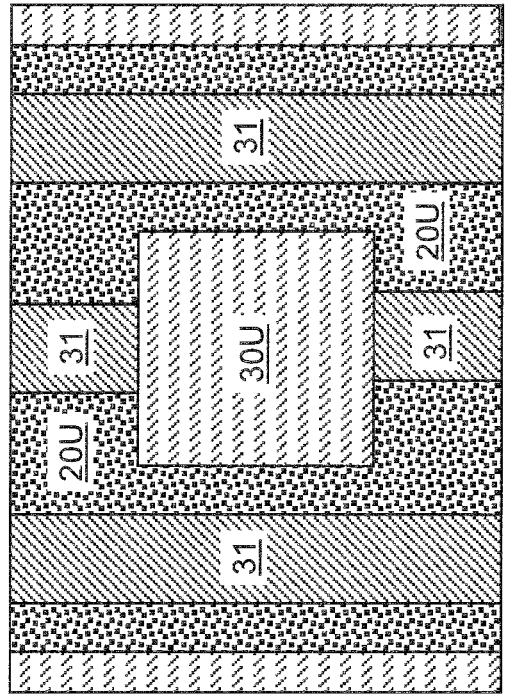
FIG. 11B is a top-down view of the fourth exemplary structure at the step corresponding to FIG. 6A.
Figure 11A:
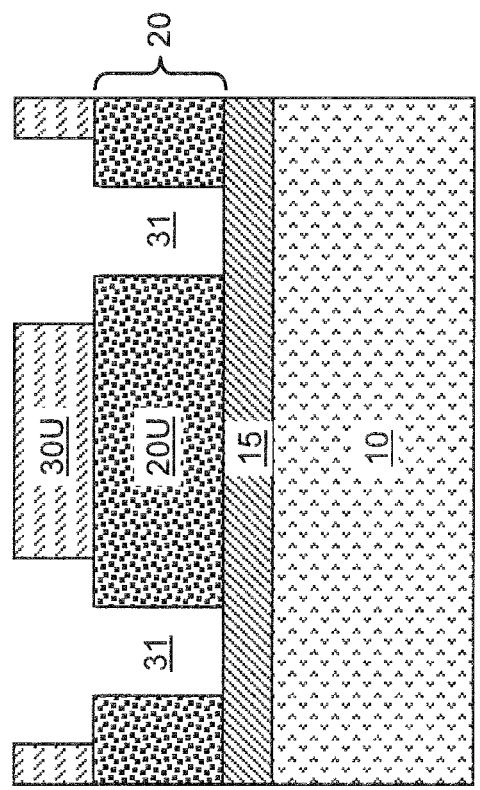
FIG. 11A is a vertical cross-sectional view of a fourth exemplary structure after removal of exposed portions of the first photoresist layer and exposed portions of the second photoresist layer according to a fourth embodiment of the present invention.

Referring to FIGS. 11A and 11B, a fourth exemplary structure according to a fourth embodiment of the present invention is derived from the third exemplary structure of FIGS. 8A-8C. In the fourth embodiment, the material of the first photoresist layer 30 is a positive photoresist that becomes chemically less stable after the first lithographic exposure. After the second lithographic exposure, the lithographically exposed first photoresist portions 30X are removed selective to lithographically unexposed first photoresist portions 30U as in the second embodiment. Then, the lithographically exposed second photoresist portions are removed selective to the lithographically unexposed second photoresist portion 20U and the lithographically unexposed first photoresist portions 30U as in the second embodiment. Top surfaces of the BARC layer 15 or the substrate 10 are exposed at the bottom of line cavities 31 that are formed in the area of the composite shape within the lithographically unexposed second photoresist portions 20U.

Figure 12B:
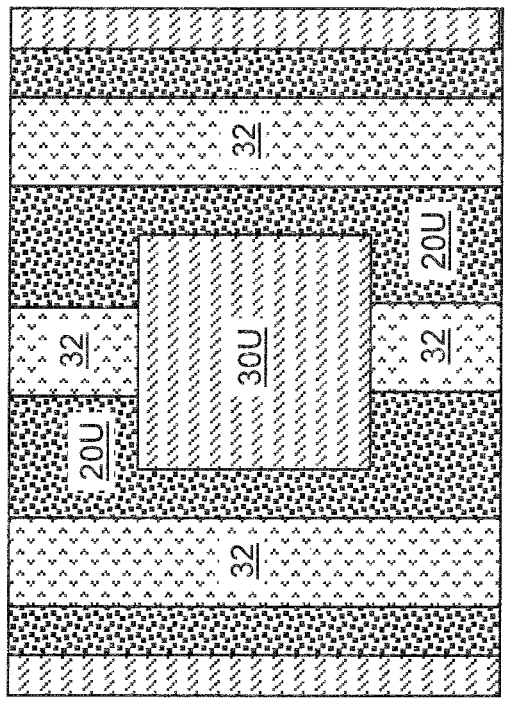
FIG. 12B is a top-down view of the fourth exemplary structure at the step corresponding to FIG. 12A.
Figure 12A:
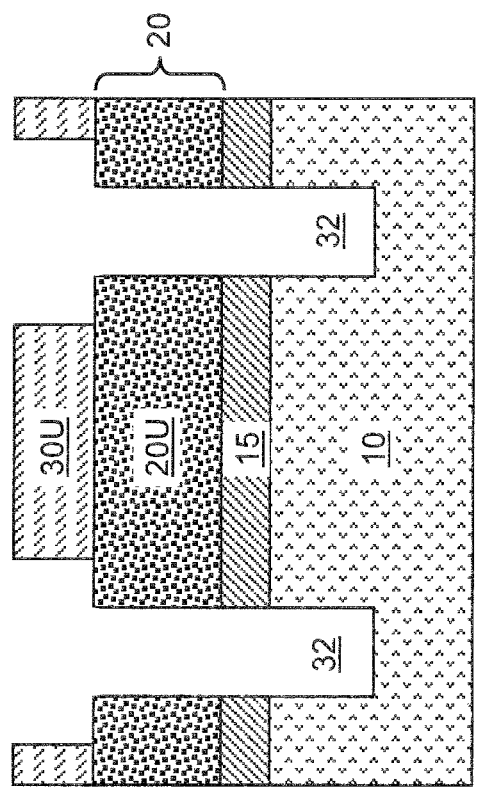
FIG. 12A is a vertical cross-sectional view of the fourth exemplary structure after transfer of a composite pattern into the substrate according to the fourth embodiment of the present invention.

Referring to FIGS. 12A and 12B, the composite pattern defined by the cavities within the lithographically unexposed second photoresist portion 20U is transferred into the BARC layer 15, if present, and into the substrate 10 in the same manner as in the second embodiment. The lithographically unexposed second photoresist portion 20U, the lithographically unexposed first photoresist portion 30U, and the BARC layer 15 are subsequently removed selective to the material of the substrate 10. The substrate 10 includes line cavities 32 in the shape of the composite pattern.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a patterned structure comprising:
    forming a stack of, from bottom to top, an underlying layer, a second photoresist layer in contact with said underlying layer, and a first photoresist layer on a substrate;
    lithographically exposing said first photoresist layer by a first illumination at a first exposure wavelength through a first mask, wherein at least one lithographically exposed first photoresist portion of said first photoresist layer becomes optically transparent at a second exposure wavelength and is formed within areas of a first pattern in said first photoresist layer;
    lithographically exposing said second photoresist layer by a second illumination at said second exposure wavelength through a second mask, said second illumination impinging on an area of a second pattern including a first area within said areas of said first pattern and a second area outside said areas of said first pattern, wherein a portion of said second photoresist layer in said first area becomes a lithographically exposed second photoresist portion and a portion of said second photoresist layer in said second area is not lithographically exposed, wherein a composite pattern is formed by at least one lithographically exposed second photoresist portion of said second photoresist layer that includes said lithographically exposed second photoresist portion, wherein said second composite pattern is the same as said second pattern that is limited only within said first pattern; and
    transferring said composite pattern into said underlying layer.

2. The method of claim 1, wherein at least one lithographically unexposed first resist portion of said first photoresist layer remain optically opaque at said second exposure wavelength after said illumination at said first exposure wavelength.

3. The method of claim 1, wherein said at least one lithographically exposed first photoresist portion remains on said second photoresist layer during said lithographically exposing of said second photoresist layer by illumination at said second exposure wavelength.

4. The method of claim 1, wherein said at least one lithographically exposed second photoresist portion is formed only beneath said at least one lithographically exposed first resist portion, but not beneath at least one lithographically unexposed first resist portion.

5. The method of claim 4, wherein said at least one lithographically exposed first photoresist portion and said at least one lithographically unexposed first photoresist portion remain on said second photoresist layer during said lithographically exposing of said second photoresist layer by illumination at said second exposure wavelength.

6. The method of claim 4, further comprising removing said at least one lithographically exposed second photoresist portion selective to at least one lithographically unexposed second photoresist portion of said second photoresist layer prior to said transferring of said composite pattern.

7. A method of forming a patterned structure comprising:
forming a stack of, from bottom to top, an underlying layer, a second photoresist layer in contact with said underlying layer, and a first photoresist layer on a substrate;
lithographically exposing said first photoresist layer by a first illumination at a first exposure wavelength through a first mask, wherein at least one lithographically exposed first photoresist portion of said first photoresist layer becomes optically transparent at a second exposure wavelength and is formed within areas of a first pattern in said first photoresist layer;
lithographically exposing said second photoresist layer by a second illumination at said second exposure wavelength through a second mask, said second illumination impinging on an area of a second pattern including a first area within said areas of said first pattern and a second area outside said areas of said first pattern, wherein a portion of said second photoresist layer in said first area becomes a lithographically exposed second photoresist portion and a portion of said second photoresist layer in said second area is not lithographically exposed, wherein a composite pattern is formed by at least one lithographically exposed second photoresist portion of said second photoresist layer that includes said lithographically exposed second photoresist portion, wherein said second composite pattern is the same as said second pattern that is limited only within said first pattern;
removing said at least one lithographically exposed first photoresist portion selective to said at least one lithographically unexposed first photoresist portion;
removing said at least one lithographically exposed second photoresist portion selective to said at least one lithographically unexposed second photoresist portion of said second photoresist layer; and
transferring said composite pattern into said underlying layer employing a combination of said at least one lithographically unexposed second photoresist portion and said at least one lithographically unexposed first photoresist portion as an etch mask.

8. The method of claim 1, wherein said second pattern comprises an array of via shapes.

9. The method of claim 1, wherein said second pattern comprises an array of line shapes.

10. The method of claim 1, wherein said second exposure wavelength is the same as said first exposure wavelength.

11. The method of claim 1, wherein said first photoresist layer comprises a gray resist.

12. The method of claim 11, wherein said gray resist comprises a resist polymer with an absorbing moiety.

13. The method of claim 12, wherein said absorbing moiety of said resist polymer of said gray resist includes at least one chemical moiety that absorb radiation at said first exposure wavelength.

14. The method of claim 7, wherein said first photoresist layer comprises a gray resist.

* * * * *